United States Patent
Feng et al.

(10) Patent No.: US 12,477,717 B2
(45) Date of Patent: Nov. 18, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Daohuan Feng, Hefei (CN); Xiaojie Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 660 days.

(21) Appl. No.: 17/815,633

(22) Filed: Jul. 28, 2022

(65) Prior Publication Data
US 2023/0397399 A1 Dec. 7, 2023

(30) Foreign Application Priority Data
Jun. 6, 2022 (CN) .......................... 202210633586.X

(51) Int. Cl.
H10B 12/00 (2023.01)

(52) U.S. Cl.
CPC .............. *H10B 12/30* (2023.02); *H10B 12/03* (2023.02); *H10B 12/05* (2023.02)

(58) Field of Classification Search
CPC ........ H10B 12/30; H10B 12/03; H10B 12/05; H10B 12/0335; H10B 12/315; H10B 12/482; H10B 12/488
See application file for complete search history.

(56) References Cited

U.S. PATENT DOCUMENTS

| 10,535,659 B2 | 1/2020 | Kim et al. |
| 2019/0035791 A1 * | 1/2019 | Zang .................... H10D 86/451 |

FOREIGN PATENT DOCUMENTS

| CN | 109616474 A | 4/2019 |

* cited by examiner

*Primary Examiner* — Fernando L Toledo
*Assistant Examiner* — Adam S Bowen
(74) *Attorney, Agent, or Firm* — Syncoda LLC; Feng Ma

(57) ABSTRACT

Embodiments of the present disclosure relate to the field of semiconductors, and provide a semiconductor structure and a manufacturing method thereof. The method of manufacturing a semiconductor structure includes: providing a base, and forming active pillars, a bit line, a word line, and memory structures. Forming the memory structures includes: providing an isolation layer between the word line and the memory structures, and forming a first conductive layer, a dielectric film, and a second conductive layer that are continuously and sequentially stacked on a side surface of the isolation layer and a surface of the active pillar; and etching to remove a part of the first conductive layer located on the side surface of the isolation layer, to expose a side surface of the dielectric film, and taking a remaining part of the first conductive layer as the first electrode plate.

14 Claims, 21 Drawing Sheets

SEMICONDUCTOR STRUCTURE AND MANUFACTURING METHOD THEREOF

CROSS-REFERENCE TO RELATED APPLICATIONS

This application claims the priority of Chinese Patent Application No. 202210633586.X, submitted to the Chinese Intellectual Property Office on Jun. 6, 2022, the disclosure of which is incorporated herein in its entirety by reference.

TECHNICAL FIELD

The present disclosure relates to the technical field of semiconductors, and in particular, to a semiconductor structure and a manufacturing method thereof.

BACKGROUND

With the continuous development of integrated circuit manufacturing technologies, in order to improve an integration degree of an integrated circuit, improve an operating speed of a memory, and reduce a power consumption of the memory, a metal-oxide-semiconductor field-effect transistor (MOSFET) device continuously reduces its feature size, and faces a series of challenges. For example, in order to reduce a device linewidth, a semiconductor structure has begun to develop from an embedded word line structure to a gate-all-around (GAA) structure. However, an integration degree of a memory device is mainly determined by an area occupied by a unit memory cell, in other words, a storage capacity of the memory device is also limited by a size of the memory device.

How to reduce the device linewidth and further increase storage density has become an important problem to be resolved by those skilled in the art.

SUMMARY

According to some embodiments of the present disclosure, an aspect of the embodiments of the present disclosure provides a method of manufacturing a semiconductor structure, including: providing a base; forming active pillars and a bit line that extends along a first direction, wherein the bit line is located on a surface of the base, the active pillars are arranged at intervals along a direction perpendicular to the surface of the base, the active pillar includes a source region, a channel region, a drain region, and a support region, and the bit line is connected to one of the source region and the drain region of the active pillar; forming a word line extending along a second direction, wherein the word line is located between adjacent active pillars and surrounds the channel region of the active pillar; and forming a plurality of memory structures, wherein the memory structures are vertically stacked on the base, the memory structure is connected to the other one of the source region and the drain region of the active pillar, the memory structure surrounds the support region of the is active pillar, and the memory structures include a first electrode plate, a first dielectric layer, and a second electrode plate that are sequentially stacked on surfaces of the support regions of the active pillars; and forming the memory structures includes: providing an isolation layer between the word line and the memory structures, and forming a first conductive layer, a dielectric film, and a second conductive layer that are continuously and sequentially stacked on a side surface of the isolation layer and a surface of the active pillar; and etching to remove a part of the first conductive layer located on the side surface of the isolation layer, to expose a side surface of the dielectric film, and taking a remaining part of the first conductive layer as the first electrode plate, a remaining part of the dielectric film as the first dielectric layer, and the second conductive layer as the second electrode plate.

According to some embodiments of the present disclosure, another aspect of the embodiments of the present disclosure provides a semiconductor structure, including: a base, wherein a bit line extending along a first direction is provided on a surface of the base; a plurality of active pillars, wherein the active pillars are arranged at intervals along a direction perpendicular to the surface of the base, the active pillar includes a source region, a channel region, a drain region, and a support region, and the bit line is connected to one of the source region and the drain region of the active pillar; a word line, wherein the word line extends along a second direction, and the word line is located between adjacent active pillars and surrounds the channel region of the active pillar; and a plurality of memory structures, wherein the memory structures are vertically stacked on the base, the memory structure is connected to the other one of the source region and the drain region of the active pillar, the memory structure surrounds the support region of the active pillar, the memory structures include a first electrode plate, a first dielectric layer, and a second electrode plate that are sequentially stacked on surfaces of the support regions of the active pillars, and an isolation layer is provided between the word line and the memory structures.

BRIEF DESCRIPTION OF THE DRAWINGS

One or more embodiments are exemplified by corresponding accompanying drawings, and these exemplified descriptions do not constitute a limitation on the embodiments. The accompanying drawings are not limited by scale unless otherwise specified. T To describe the technical solutions in the embodiments of the present disclosure or in the prior art more clearly, the following outlines the drawings to be used in the embodiments of the present disclosure. Evidently, the drawings outlined below are merely some embodiments of the present disclosure. Those of ordinary skill in the art may derive other drawings from the outlined drawings without making any creative effort.

DETAILED DESCRIPTION

Embodiments of the present disclosure provide a method of manufacturing a semiconductor structure. Memory structures are formed, wherein the memory structure surrounds a support region of an active pillar, such that the memory structures can be formed on a surface of a base through 3D stacking, and the memory structures are vertically stacked on the base, which can reduce the line width of the semiconductor structure, and increase the memory density of the semiconductor structure in a limited cell area. In addition, in the forming the memory structures, a part of a first conductive layer located on a side surface of an isolation layer is removed through etching, and a side surface of a dielectric film is exposed. The remaining part of the first conductive layer is used as a first electrode plate, the remaining part of the dielectric film is used as a first dielectric layer, and the second conductive layer is used as a second electrode plate, which can avoid failure of the memory structure due to an electrical connection between parts of the first electrode plate connected to is different transistors in a direction perpendicular to the surface of the base, thereby helping improve the stability of the semiconductor structure.

The embodiments of the present disclosure are described in detail below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

FIG. 1 to FIG. 17 are schematic structural diagrams corresponding to a method of manufacturing a semiconductor structure according to an embodiment of the present disclosure. FIG. 1 to FIG. 11 are schematic structural diagrams corresponding to a method of manufacturing a semiconductor structure along a cross section A-A' (referring to FIG. 35) according to an embodiment of the present disclosure. FIG. 12 to FIG. 17 are schematic structural diagrams corresponding to a method of manufacturing a semiconductor structure along a cross section B-B' (referring to FIG. 35) according to an embodiment of the present disclosure.

Figure 1:
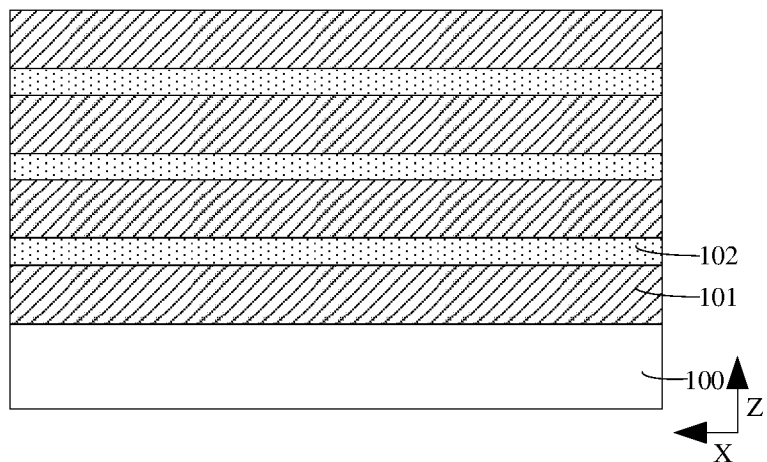
FIG. 1 to FIG. 17 are schematic structural diagrams corresponding to a method of manufacturing a semiconductor structure according to an embodiment of the present disclosure.
Figure 12:
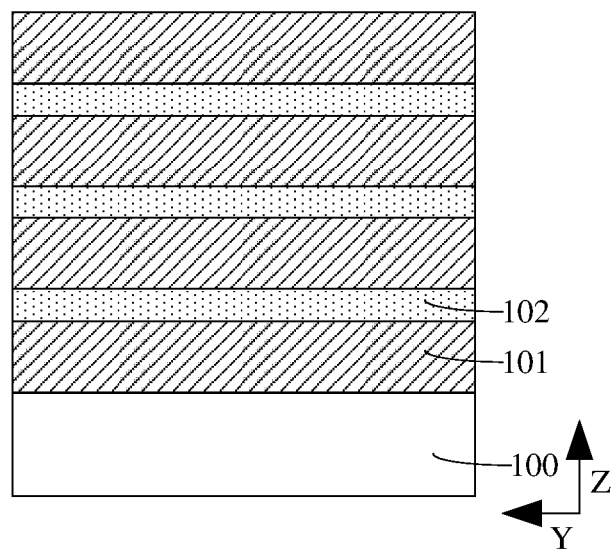

Referring to FIG. 1 or FIG. 12, a base 100 is provided. First sacrificial films 101 and semiconductor layers 102 arranged at intervals are sequentially formed on a surface of the base 100.

The base 100 may alternatively be an initial base. In some embodiments, a material of the base 100 may be a semiconductor material. The semiconductor material specifically may be any one from the group consisting of silicon, germanium, silicon germanide, or silicon carbide.

In some embodiments, the semiconductor layers 102 are used for forming active pillars subsequently. A material of the first sacrificial film 101 may be an oxide or silicon germanide, and the oxide may include silicon oxide, aluminum oxide or titanium oxide. A material of the semiconductor layer 102 may be silicon, germanium, doped polycrystalline silicon, undoped polycrystalline is silicon, or amorphous silicon. A dopant element may be an N-type element or a P-type element. The N-type element may be a group V element such as phosphorus (P), bismuth (Bi), antimony (Sb) or arsenic (As), and the P-type element may be a group III element such as boron (B), aluminum (Al), gallium (Ga) or indium (In).

Referring to FIG. 2 to FIG. 11 and FIG. 13 to FIG. 17, active pillars 110 and a bit line 130 that extends along a first direction are formed. The bit line 130 is located on the surface of the base 100. The active pillars 110 are arranged along a direction perpendicular to the surface of the base 100. The active pillar 110 includes a source region 111, a channel region 112, a drain region 113, and a support region 114. The bit line 130 is connected to one of the source region 111 and the drain region 113 of the active pillar 110. A word line 120 extending along a second direction is formed. The word line 120 is located between adjacent active pillars 110 and surrounds the channel region 112 of the active pillar 110. A plurality of memory structures 140 are formed. The memory structures 140 are vertically stacked on the base 100. The memory structure 140 is connected to the other one of the source region 111 and the drain region 113 of the active pillar 110. The memory structure 140 surrounds the support region 114 of the active pillar 110. The memory structures 140 include a first electrode plate 141, a first dielectric layer 142, and a second electrode plate 143 that are sequentially stacked on surfaces of the support regions 114 of the active pillars 110.

Figure 2:
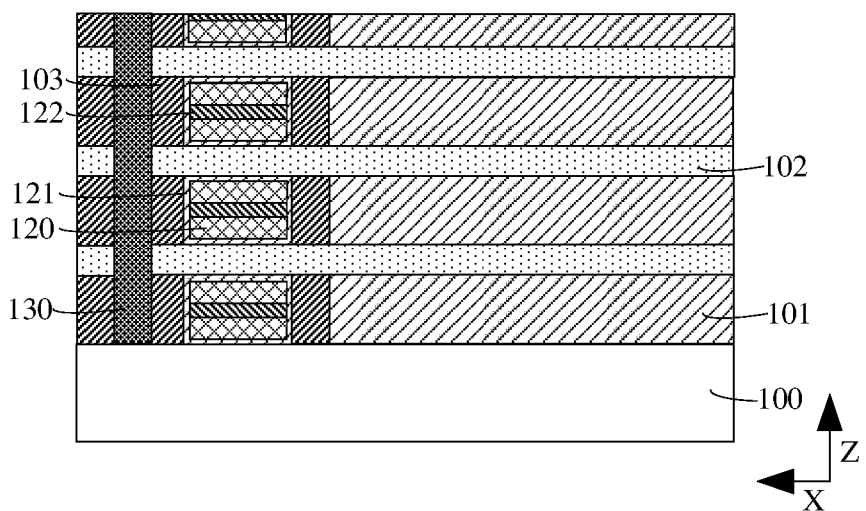

In some embodiments, the first direction is direction Z perpendicular to the surface of the base 100 in FIG. 2. The second direction is direction Y parallel to the surface of the base 100 (referring to FIG. 13). The bit line 130 and the word line 120 may be formed before the memory structures 140 are formed. In other embodiments, the first direction is direction Y parallel to the surface of the base 100 (referring to FIG. 13), and the second direction is direction Z perpendicular to the surface of the base 100 in FIG. 2. The memory structures may be formed before the bit line and the word line are formed.

In some embodiments, the semiconductor layers 102 shown in FIG. 2 are configured to form the active pillars 110 (referring to FIG. 11), the bit line 130 is connected to the source region 111 of the active pillar 110, and the memory structure 140 is connected to the drain region 113 of the active pillar 110. In other embodiments, the bit line 130 is connected to the drain region 113 of the active pillar 110, and the memory structure 140 is connected to the source region 111 of the active pillar 110.

In some embodiments, the bit line 130 may be a metal bit line, and a material of the bit line 130 may be tungsten, copper, molybdenum, silver, or other metal. The metal has low resistance, which helps improve the conductivity of the bit line 130 and the active pillar 110. In other embodiments, the bit line 130 may be a semiconductor bit line, and a material of the semiconductor bit line may be silicon, germanium, silicon germanide, silicon carbide or polysilicon. Moreover, the semiconductor bit line is doped with an element of the same type as the element doped in the semiconductor layer 102. The dopant element may be used as carriers, to facilitate migration and diffusion of carriers between the bit line 130 and the active pillar 110, thereby helping improve the conductivity of the bit line 130 and the active pillar 110.

In some embodiments, the word line 120, the channel region 112 of the active pillar 110, and the source region 111 and the drain region 113 of the active pillar 110 that are located at two ends of the channel region 112 form a transistor structure. Along a direction from the source region 111 to the drain region 113, at least two transistor structures are provided. Two transistor structures are electrically connected to the same bit line 130, such that the two transistor structures share the bit line 130; in addition, along direction X parallel to the base 100, the memory structure 140 located at another terminal of the transistor structure may share the same bit line 130. In this way, the embodiments of the present disclosure can implement 3D stacking, and reduce the size of the critical device by sharing the bit line 130, thereby improving the performance of the semiconductor device and the stability of the semiconductor structure.

In some embodiments, the word line 120 is used as a gate of the semiconductor structure, and the word line 120 surrounds the channel region 112 of the active pillar 110, that is, the semiconductor structure is a GAA structure. In the GAA structure, the gate can surround the channel region of the semiconductor on all sides, which can desirably solve the problems such as leakage current, capacitance effect, and short channel effect due to reduced spacing between gates, and reduce the area occupied by the word line 120 in the vertical direction, thereby helping improve the gate control performance and the integration of the semiconductor structure.

In some embodiments, a material of the word line 120 is any one from the group consisting of tungsten, tantalum, molybdenum, titanium nitride or tantalum nitride, to form a metal gate line. In other embodiments, the material of the word line is doped polycrystalline silicon. The polycrystalline silicon has a similar energy gap with the material of the active pillar that serves as a channel, and a work function of the polycrystalline silicon can be changed by controlling a doping concentration, which helps reduce a threshold voltage between the gate and the channel region of the active pillar. A dopant element type of the doped polycrystalline silicon is the same as or different from a dopant element type of the channel region of the active pillar.

In some embodiments, the memory structure 140 may be a capacitor structure, and the support region 114 of the active pillar 110 may be used as a support layer of the capacitor structure. The semiconductor structure may form a one-transistor one-capacitor (1T-1C) structure. With a limited device cell area, the area occupied by the memory structure is maximized, which helps improve the memory density. A part of the first electrode plate 141 is used as a bottom electrode plate of the capacitor structure, and a part of the second electrode plate 143 may be used as a top electrode plate of the capacitor structure. The second electrode plate 143 may be a common electrode of a plurality of capacitor structures. The memory structure 140 may be used as a memory element configured to store data.

Specifically, referring to FIG. 2, the bit line 130 extending along the first direction is formed, wherein the bit line 130 is located on the surface of the base 100; the word line 120 extending along the second direction is formed, wherein the word line 120 is located between adjacent semiconductor layers 102 and surrounds a part of the semiconductor layer 102; the isolation layer 103 is formed, wherein the isolation layer 103 is located between adjacent semiconductor layers 102, between the bit line 130 and the word line 120, and between the word line and the first sacrificial film 101.

In some embodiments, the semiconductor layer 102 surrounded by the word line 120 is configured to form the channel region of the active pillar. The isolation layer 103 achieves an insulated isolation effect, and a material of the isolation layer 103 may be silicon nitride, silicon oxide, or other high-K materials. The high-K material may include hafnium oxide, zirconia, aluminum oxide, lanthanum oxide, titanium oxide, tantalum oxide, niobium oxide or strontium titanate.

In some embodiments, referring to FIG. 2, the method of manufacturing a semiconductor structure further includes: forming a gate dielectric layer 121, wherein the gate dielectric layer 121 is located between the word line 120 and the semiconductor layer 102 and between the word line 120 and the isolation layer 103, and the gate dielectric layer 121 is formed before the word line 120 is formed. A material of the gate dielectric layer 121 may be silicon oxide, silicon carbide, silicon nitride or other high-K materials, to suppress the short channel effect, thereby suppressing the tunneling leakage current and the like.

In some embodiments, referring to FIG. 2, the forming the word lines 120 includes: forming a conductive film, wherein the conductive film surrounds the semiconductor layer 102, and etching the conductive film to form word lines 120 that are arranged at intervals; forming a second isolation layer 122, wherein a part of the second isolation layer 122 is located between adjacent word lines 120 along direction Z perpendicular to the surface of the base 100 to isolate the adjacent word lines 120, so as to avoid short-circuit caused by an electrical connection between the adjacent word lines 120. A material of the second isolation layer 122 may be silicon oxide, silicon carbide, or silicon nitride.

Figure 3:
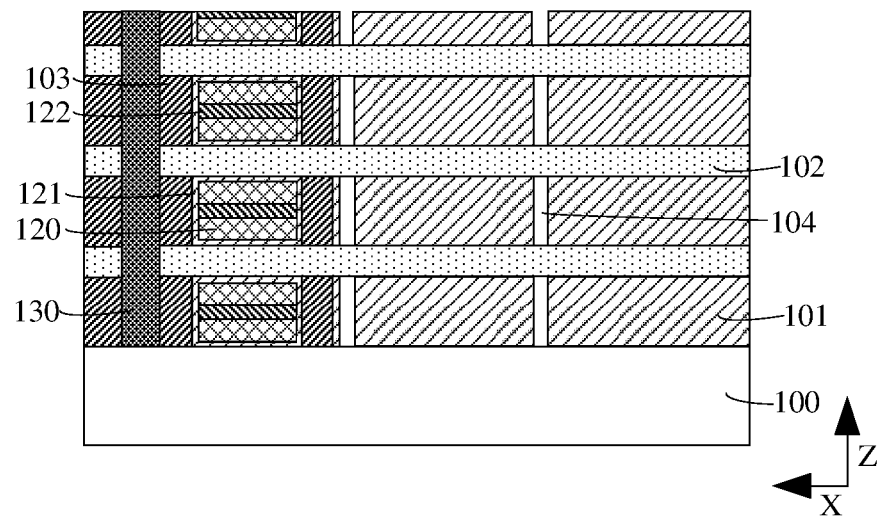
Figure 13:
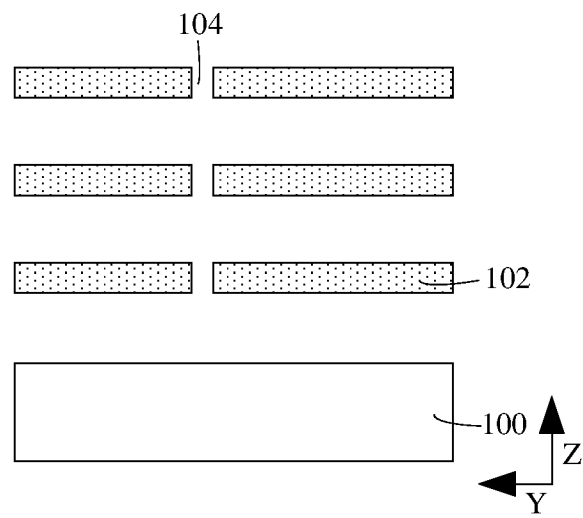

Referring to FIG. 3 and FIG. 13, a part of the first sacrificial films 101 and a part of the semiconductor layers 102 are patterned, to form first grooves 104 (referring to FIG. 13). A bottom of the first groove 104 exposes the base 100; a part of the first sacrificial films 101 exposed by the first grooves 104 is removed through etching along the second direction, to expose a surface of a remaining part of the semiconductor layers 102.

It should be noted that, a side surface of the first groove 104 does not expose the side surface of the isolation layer 103, such that a part of the first sacrificial films 101 is located between the first groove 104 (referring to FIG. 13) and the isolation layer 103, to expose the continuous first conductive layer through the part of the first sacrificial films 101 subsequently. In this way, the part of the first conductive layer located on the isolation layer is completely etched to form the first electrode plate. Therefore, parts of the first conductive layer corresponding to different transistors are not electrically connected, that is, parts of the first conductive layer are disconnected, to avoid failure of the memory structure.

It may be understood that, in other embodiments, first grooves that exposes the side surface of the isolation layer may be formed, and the isolation layer is partially etched along the width direction to expose the part of the first conductive layer located on the isolation layer.

Figure 4:
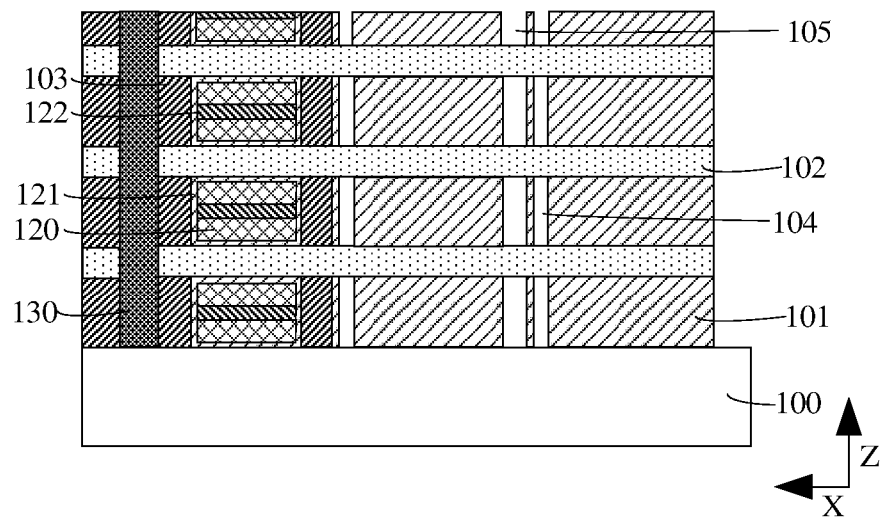

Referring to FIG. 4, along the third direction (direction X parallel to the surface of the base), the end portion of the first sacrificial films 101 and the end portion of the semiconductor layers 102 are patterned, to expose the base 100; the first sacrificial films 101 and the semiconductor layers 102 are patterned to form a third groove 105, wherein the third groove 105 is located between adjacent first grooves 104.

The part of the first sacrificial films 101 exposed by the third groove 105 is removed through etching along the second direction, to expose the surface of the remaining part of the semiconductor layer 102. The is third groove 105 is configured to form an isolation structure between two adjacent columns of memory structures along an arrangement direction of the source region and the drain region.

Figure 5:
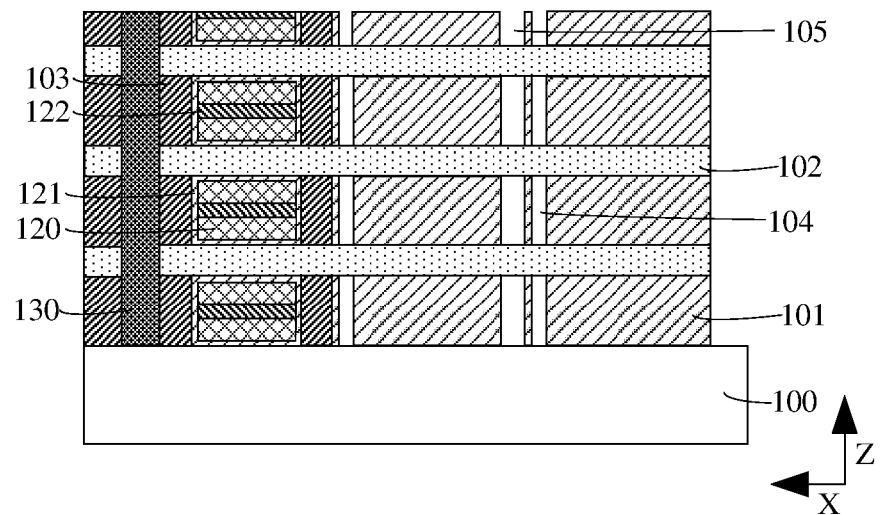
Figure 14:
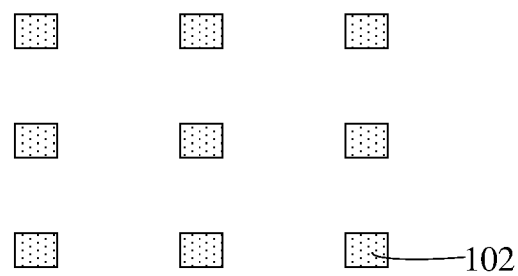

In other embodiments, three first grooves sequentially arranged along direction X are formed first, and then a part of the semiconductor layers and a part of the first sacrificial films that are located on two sides of the first groove in the middle are etched to form a third groove, that is, the width of the first groove in the middle is increased.

referring to FIG. 5 and FIG. 14, the first sacrificial films 101 and the semiconductor layers 102 are patterned to form parts of the semiconductor layers 102 arranged at intervals, wherein the parts of the semiconductor layers 102 are configured to form the active pillars subsequently.

Figure 6:
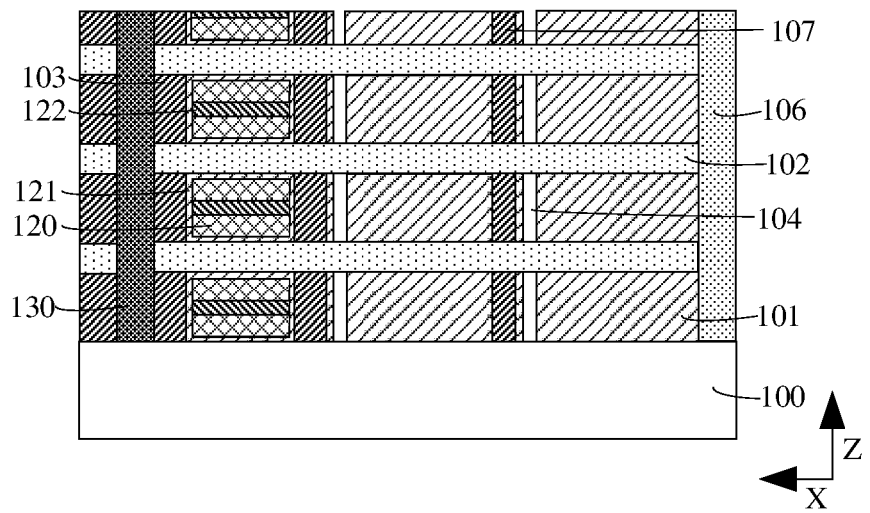

Referring to FIG. 6, a second sacrificial film 107 is formed in the third groove 105 (referring to FIG. 5); a first isolation layer 106 is formed on the surface of the base 100, and the first isolation layer 106 is further located on the side surface of the first sacrificial films 101 and the side surface of the semiconductor layers 102. A material of the second sacrificial film 107 includes silicon nitride, titanium nitride, aluminum nitride, gallium nitride or indium nitride; a material of the first isolation layer 106 includes any one or more from the group consisting of silicon oxide, silicon nitride, or a high-k material, and the high-k material may include hafnium oxide, zirconia, aluminum oxide, lanthanum oxide, titanium oxide, tantalum oxide, niobium oxide or strontium titanate.

Figure 7:
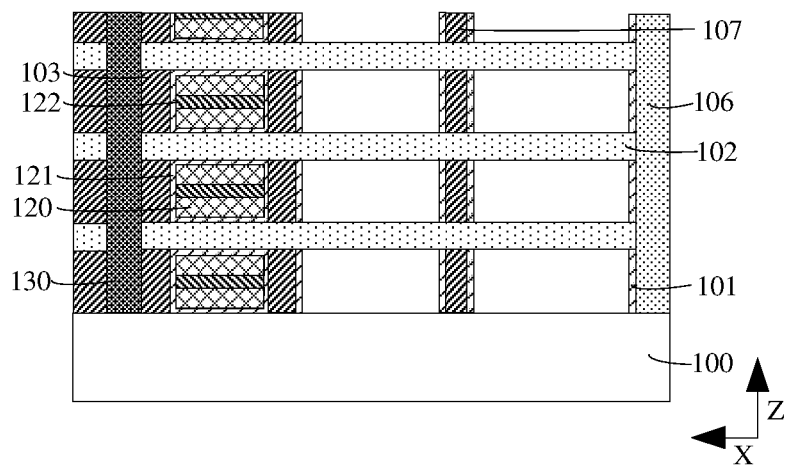

Referring to FIG. 7, a part of the first sacrificial films 101 is etched along the first groove 104 (referring to FIG. 5). Along direction X, a part of the first sacrificial films 101 located on the side surface of the isolation layer 103 is retained by partial width, and a part of the first sacrificial films 101 located on the side surface of the second sacrificial film 107 and a part of the first sacrificial films 101 located on the side surface of the first isolation layer 106 are retained. The remaining part of the first sacrificial films 101 can be used as a protective is layer, to avoid damage on the isolation layer 103 and the first isolation layer 106 during etching. Moreover, the remaining part of the first sacrificial films 101 can be etched to expose the side surface of the first conductive layer, such that the first conductive layer can be etched back. In other embodiments, all the first sacrificial films can be removed to expose the side surface of the isolation layer, the side surface of the second sacrificial film, and the side surface of the first isolation layer.

Figure 8:
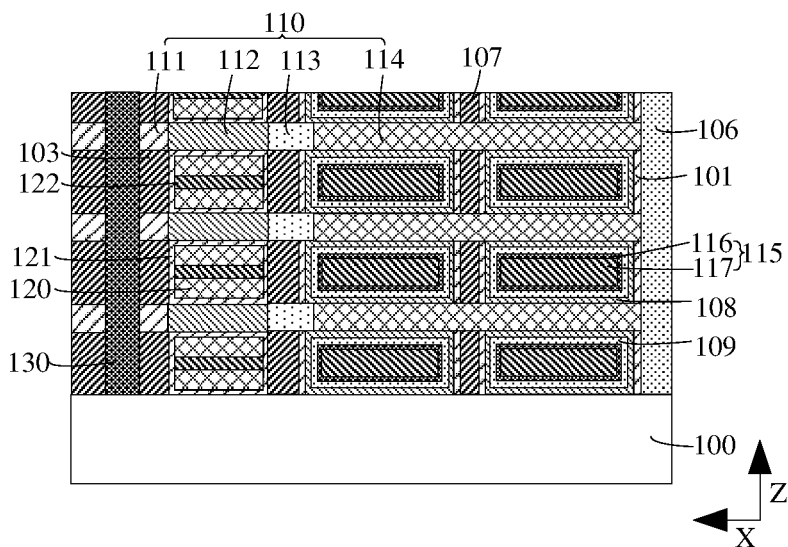
Figure 15:
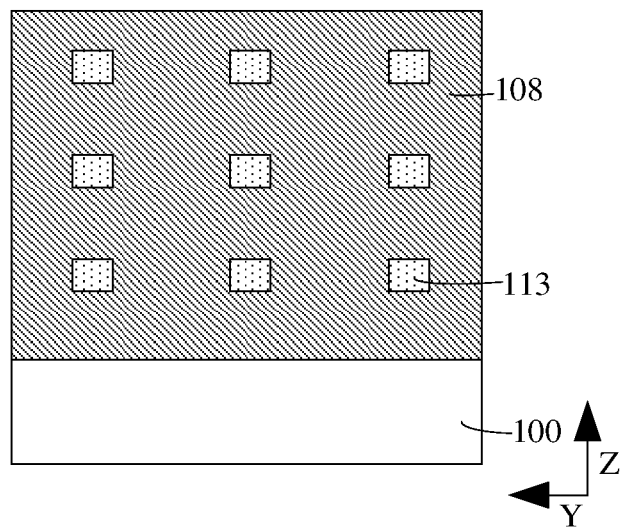

Referring to FIG. 8 and FIG. 15, the first conductive layer 108, the dielectric film 109, and the second conductive layer 115 that are continuously and sequentially stacked are formed on the side surface of the isolation layer 103 and the surface of the active pillar 110.

Specifically, the first conductive layer 108, the dielectric film 109, the metal film 116, and the semiconductor film 117 that are continuously and sequentially stacked are formed on the side surface of the remaining part of the first sacrificial films 101 and the side surface of the active pillar 110. The metal film 116 and the semiconductor film 117 jointly form the second conductive layer 115.

In some embodiments, a material of the first conductive layer 108 includes tungsten, tantalum, or molybdenum. A material of the dielectric film 109 may include any one or more from the group consisting of silicon oxide, silicon nitride, or a high-k material. The high-k material may include hafnium oxide, zirconia, aluminum oxide, lanthanum oxide, titanium oxide, tantalum oxide, niobium oxide or strontium titanate. The metal film 116 may be used as a metal barrier layer, and a material of the metal film 116 may be titanium nitride or tantalum nitride. A material of the semiconductor film 117 may be doped polycrystalline silicon or undoped polycrystalline silicon.

Figure 9:
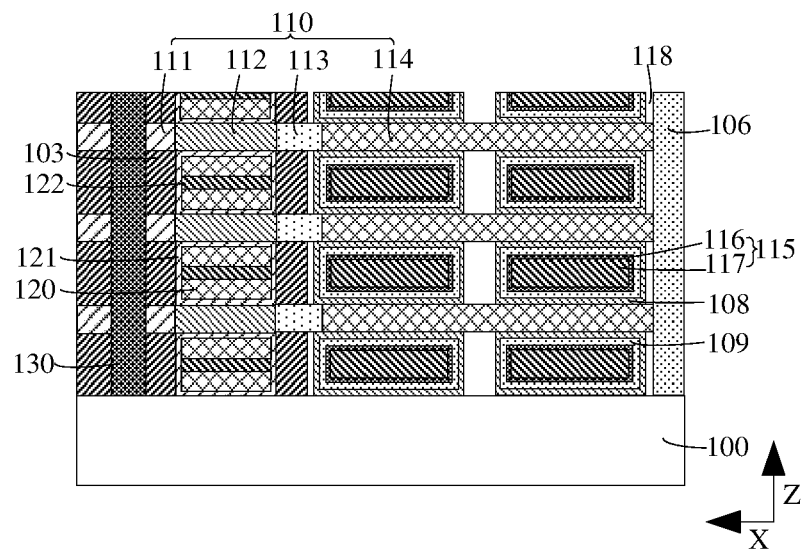

Referring to FIG. 9, a part of the first sacrificial films 101 (referring to FIG. 13) and a part of the semiconductor layers 102 (referring to FIG. 13) are patterned, to form a second groove 118, wherein the bottom of the second groove 118 exposes the base 100, and a part of the first sacrificial films 101 is is removed to expose the side surface of the first conductive layer 108. The second sacrificial film 107 is removed while the first sacrificial films 101 are removed.

Figure 10:
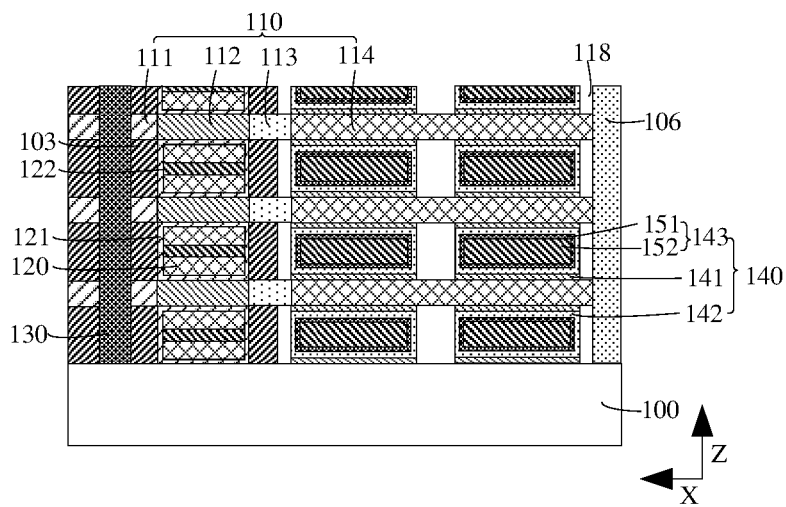
Figure 16:
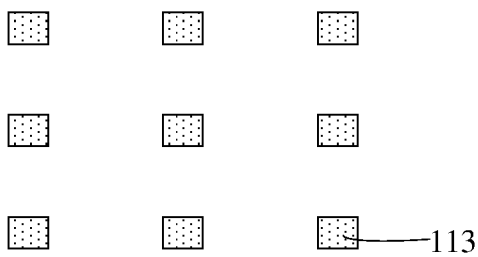
Figure 16:
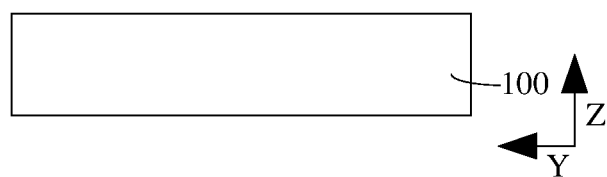

Referring to FIG. 10 and FIG. 16, a part of the first conductive layer 108 (referring to FIG. 9) on the side surface of the isolation layer 103 is removed through etching, to expose the side surface of the dielectric film 109 (referring to FIG. 9), and the remaining part of the first conductive layer 108 (referring to FIG. 9) is used as the first electrode plate 141, the remaining part of the dielectric film 109 (referring to FIG. 9) is used as the first dielectric layer 142, and the second conductive layer 115 (referring to FIG. 9) is used as the second electrode plate 143.

In some embodiments, while the part of the first conductive layer 108 (referring to FIG. 9) on the side surface of the isolation layer 103 is removed, the dielectric film 109 (referring to FIG. 9) is thinned along the arrangement direction of the source region 111 and the drain region 113 of the active pillar 110. By thinning the dielectric film 109, it can ensure that the continuous first conductive layer is completely disconnected, to avoid failure of the memory structure caused by connection between parts of the first conductive layer corresponding to different transistors.

Figure 11:
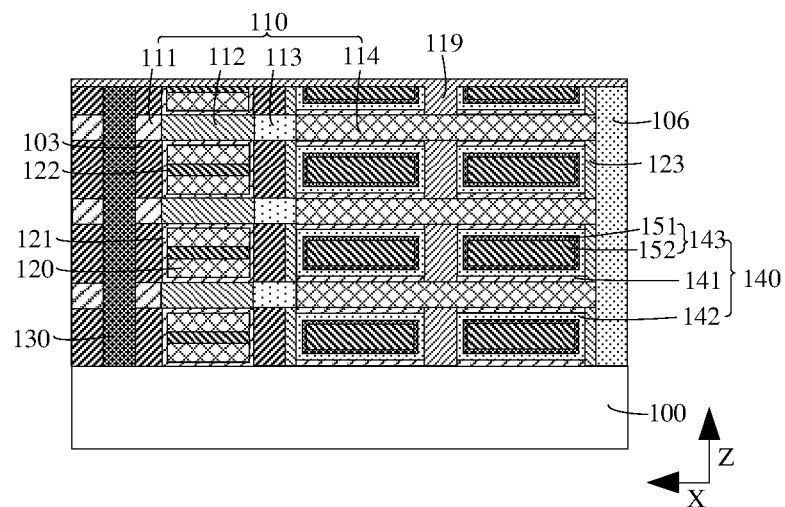
Figure 17:
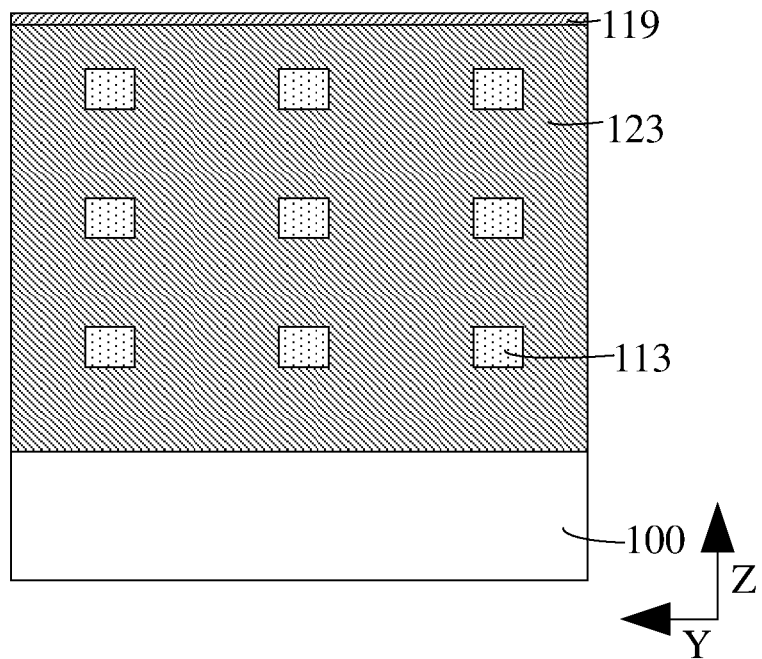

Referring to FIG. 11 and FIG. 17, a dielectric layer 119 is formed, where the dielectric layer 119 fills a space between the memory structure 140 and the isolation layer 103 and a space between memory structures 140 arranged in parallel. The dielectric layer 119 is further located on the surface of the second electrode plate 143. A material of the dielectric layer 119 may include a silicon-oxygen compound, a silicon-nitrogen compound, or a silicon-nitrogen-oxide compound. For example, the silicon-oxygen compound specifically may be silicon oxide, the silicon-nitrogen compound specifically may be silicon nitride, and the silicon-nitrogen-oxide compound may be specifically silicon carbon-nitrogen oxide.

A second dielectric layer 123 is formed. Along the direction perpendicular is to the surface of the base 100, the second dielectric layer 123 is located between the support regions 114 of adjacent active pillars 110. The second dielectric layer 123 is further located on the side surface of the first dielectric layer 142. A thickness of a part of the first dielectric layer 142 located on the surface of the first electrode plate 141 is greater than or equal to the thickness of a part of the first dielectric layer 142 located on the side surface of the second dielectric layer 123. In this way, it can be ensured that the continuous first conductive layer is completely disconnected, to avoid failure of the memory structure caused by connection between parts of the first conductive layer corresponding to different transistors.

In other embodiments, the material of the dielectric layer 119 is the same as the material of the second dielectric layer 123, and the second dielectric layer 123 may be formed while the dielectric layer 119 is formed. In this way, the process of manufacturing the dielectric layer 119 and the second dielectric layer 123 can be simplified, thereby simplifying the process of manufacturing the semiconductor structure and reducing costs.

In the embodiments of the present disclosure, by forming the memory structures 140 stacked on the surface of the base 100 and using the support region 114 of the active pillar 110 as a support layer of the memory structure 140, transistors and capacitor structures can be stacked on the surface of the base 100 in a 3D manner to improve the integration of 3D memory structures, thereby improving the memory density of the semiconductor structure. Moreover, instead of extending along a direction perpendicular to the base 100, the memory structure 140 extends along a direction parallel to the base 100, which can reduce the line width in the vertical direction. In addition, the first conductive layer 108, the dielectric film 109, and the second conductive layer 115 that are continuously and sequentially stacked are formed on the side surface of the isolation layer 103 and the surface of the active pillar 110. In this case, a part of the first conductive layer 108 located on the surfaces of different active pillars 110 is continuous, that is, different active pillars 110 are in is communication. In this solution, after the first conductive layer 108, the dielectric film 109, and the second conductive layer 115 are formed, the first conductive layer 108 is etched back. Specifically, a part of the first conductive layer 108 on the surface of the isolation layer 103 is removed through etching, such that a part of the first conductive layer 108 located on the surfaces of different active pillars 110 can be separated, to avoid the problem of failure of the memory structure 140 due to communication between parts of the first electrode plate 141 corresponding to different transistor structures.

An embodiment of the present disclosure further provides a method of manufacturing a semiconductor structure. FIG. 18 to FIG. 34 are schematic structural diagrams corresponding to a method of manufacturing a semiconductor structure according to another embodiment of the present disclosure. FIG. 18 to FIG. 26 are schematic structural diagrams corresponding to a method of manufacturing a semiconductor structure along a cross section A-A' (referring to FIG. 39) according to an embodiment of the present disclosure. FIG. 27 to FIG. 34 are schematic structural diagrams corresponding to a method of manufacturing a semiconductor structure along a cross section B-B' (referring to FIG. 39) according to an embodiment of the present disclosure. Contents same as or corresponding to those in the above embodiment will not be described again.

Figure 18:
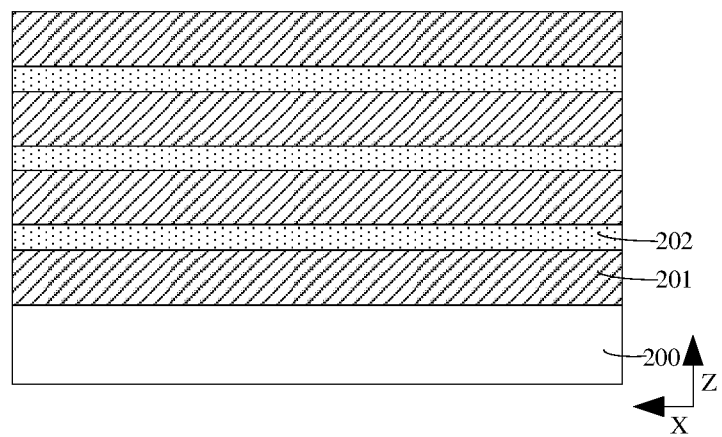
FIGS. 18 to 34 are schematic structural diagrams corresponding to a method of manufacturing a semiconductor structure according to another embodiment of the present disclosure.
Figure 27:
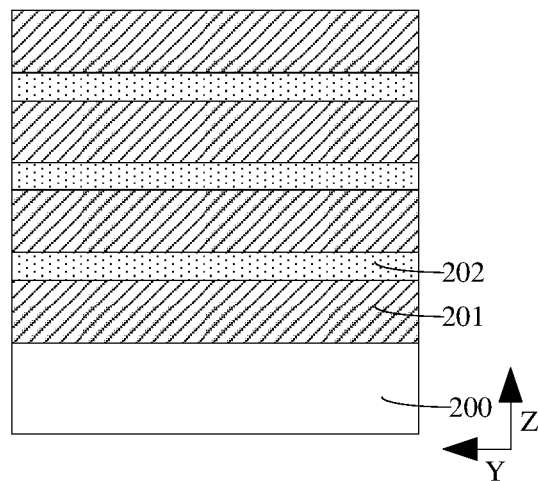

Referring to FIG. 18 and the FIG. 27, a base 200 is provided. First sacrificial films 201 and semiconductor layers 202 arranged at intervals are sequentially formed on a surface of the base 200.

Referring to FIG. 19 to FIG. 11 and FIG. 28 to FIG. 17, active pillars 210 and a bit line 230 that extends along a first direction are formed. The bit line 230 is located on the surface of the base 200. The active pillars 210 are arranged along a direction perpendicular to the surface of the base 200. The active pillar 210 includes a source region 211, a channel region 212, a drain region 213, and a support region 214. The bit line 230 is connected to one of the source region 211 and the drain region 213 of the active pillar 210. A word is line 220 extending along a second direction is formed. The word line 220 is located between adjacent active pillars 210 and surrounds the channel region 212 of the active pillar 210. A plurality of memory structures 240 are formed. The memory structures 240 are vertically stacked on the base 200. The memory structure 240 is connected to the other one of the source region 211 and the drain region 213 of the active pillar 210. The memory structure 240 surrounds the support region 214 of the active pillar 210. The memory structures 240 include a first electrode plate 241, a first dielectric layer 242, and a second electrode plate 243 that are sequentially stacked on surfaces of the support regions 214 of the active pillars 210. Along direction X, a side surface of the first electrode plate 241, a side surface of the first dielectric layer 242, and a side surface of the second electrode plate 243 are flush with each other.

Figure 19:
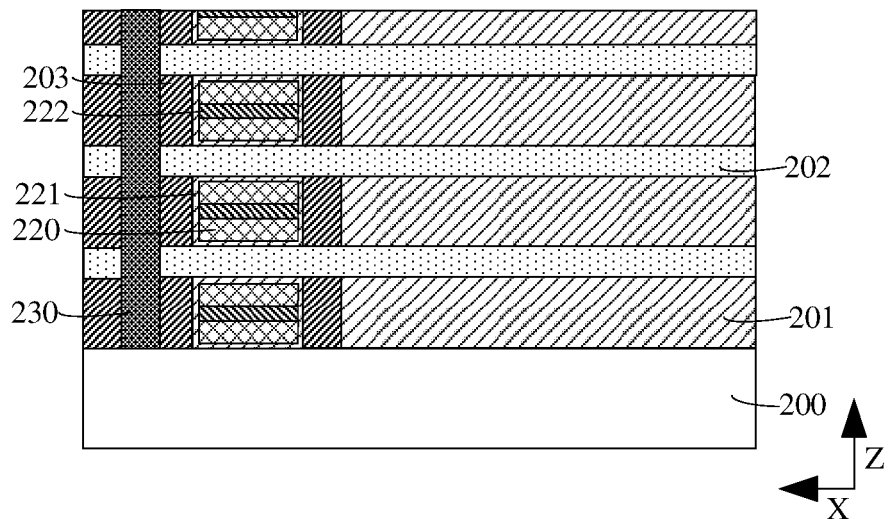

Specifically, referring to FIG. 19, the bit line 230 extending along the first direction is formed, wherein the bit line 230 is located on the surface of the base 200; the word line 220 extending along the second direction is formed, wherein the word line 220 is located between adjacent semiconductor layers 202, and the word line 220 surrounds a part of the semiconductor layer 202; the isolation layer 203 is formed, wherein the isolation layer 203 is located between adjacent semiconductor layers 202, between the bit line 230 and the word line 220, and between the word line and the first sacrificial film 201.

Figure 20:
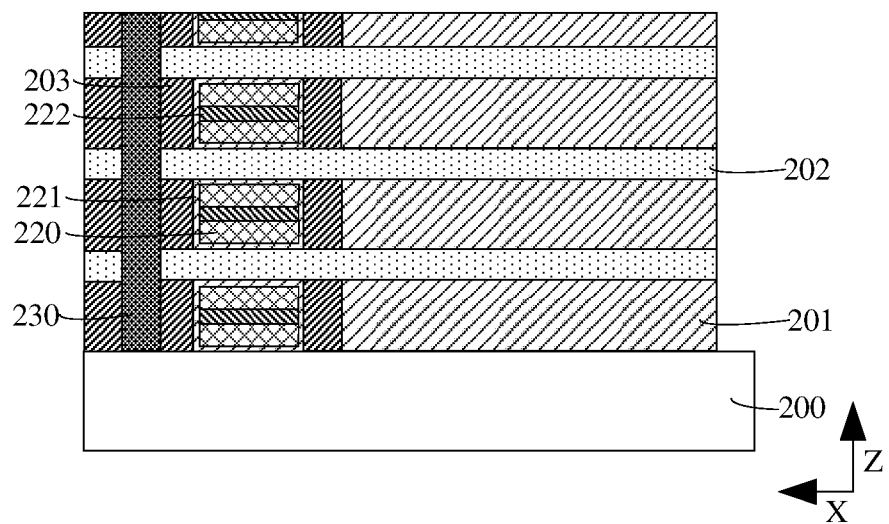

Referring to FIG. 20, along a third direction (direction X parallel to the surface of the base), an end portion of the first sacrificial films 201 and an end portion of the semiconductor layers 202 are patterned to expose the base 200.

Figure 21:
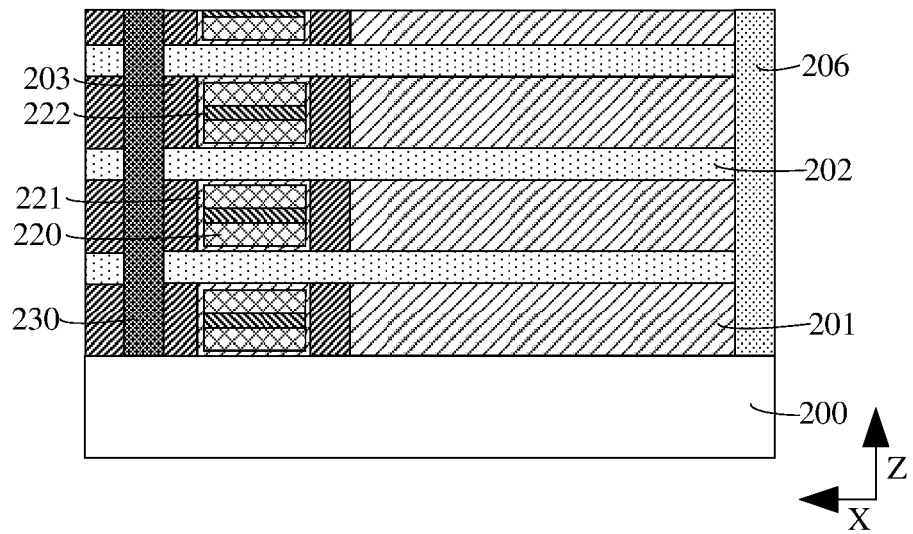

Referring to FIG. 21, a first isolation layer 206 is formed on the surface of the base 200, wherein the first isolation layer 206 is further located on a side surface of the first sacrificial films 201 and a side surface of the semiconductor layers 202.

Figure 28:
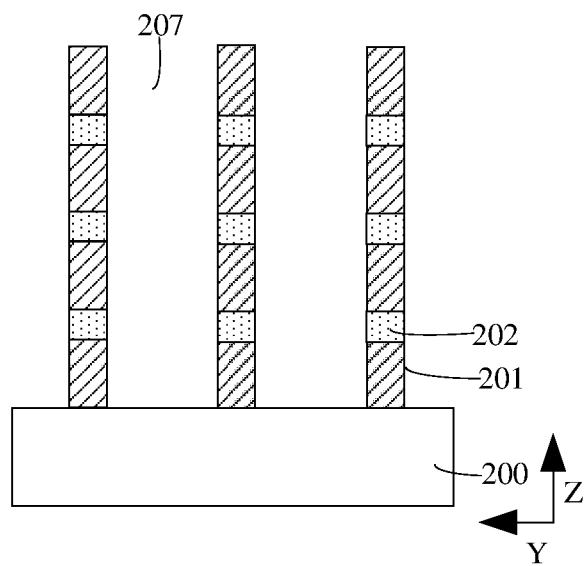

Referring to FIG. 28, the first sacrificial films 201 and the semiconductor layers 202 are patterned to form a fifth groove 207.

In some embodiments, the formed fifth groove 207 is used for removing a is part of the first sacrificial films through etching, and forming parts of the semiconductor layers 202 arranged at intervals. Positions of parts of the semiconductor layers 202 correspond to parts of the semiconductor layers 202 surrounded by the word lines 220, that is, the active pillars arranged at intervals are formed.

Figure 22:
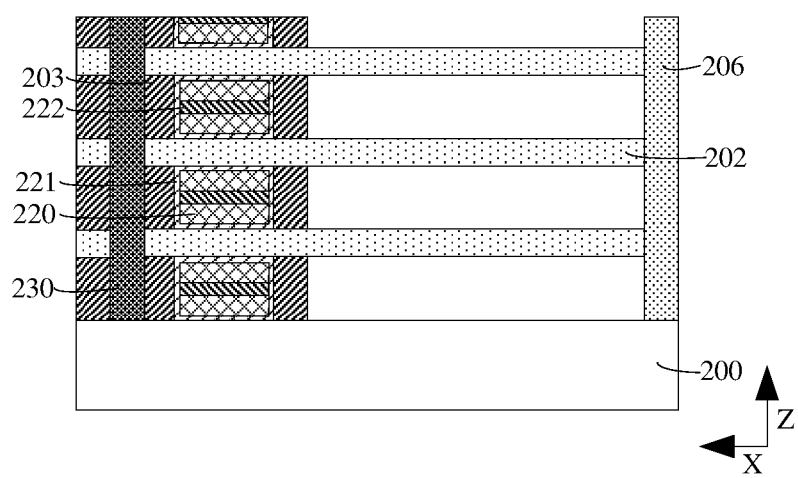
Figure 29:
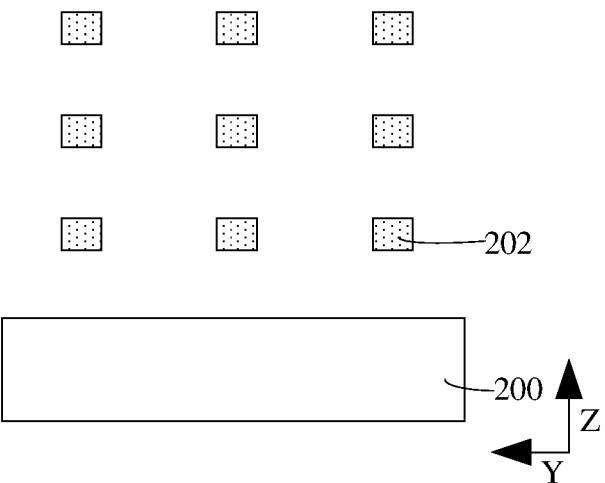

Referring to FIG. 22 and FIG. 29, a part of the first sacrificial films 201 exposed by the fifth groove 207 is removed through etching along the second direction, to expose the surface of a remaining part of the semiconductor layers 202.

Figure 23:
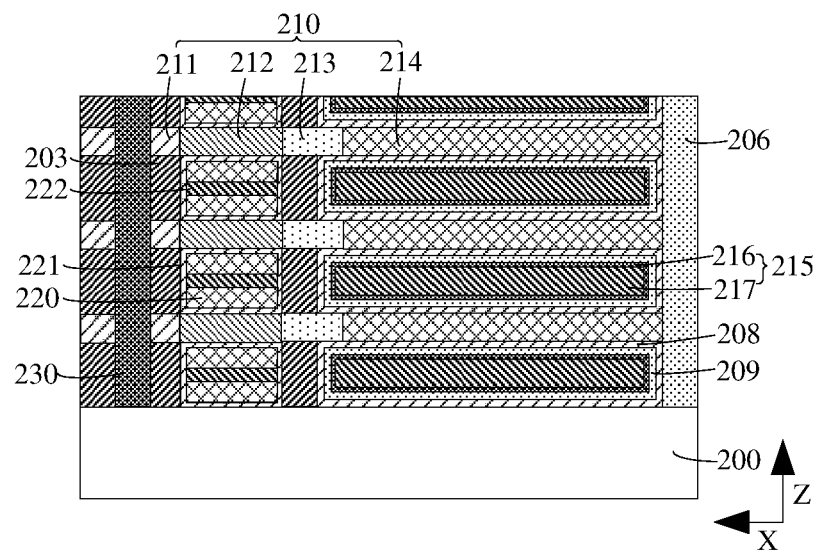
Figure 30:
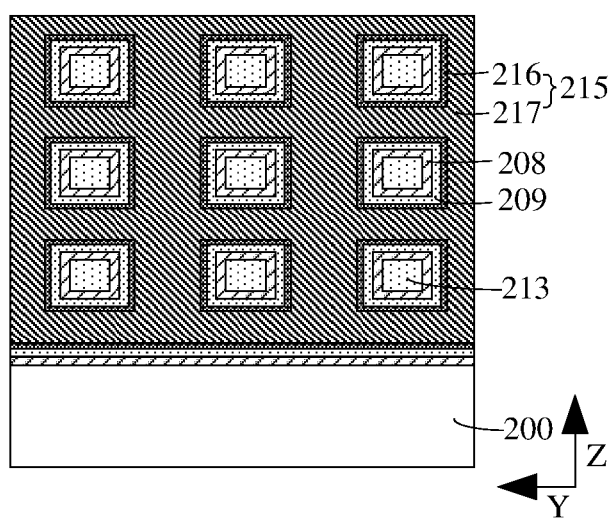

Referring to FIG. 23 and FIG. 30, a first conductive layer 208, a dielectric film 209, a metal film 216, and a semiconductor film 217 that are continuously and sequentially stacked are formed on the surface of the base 200, the side surface of the isolation layer 203, the side surface of the first isolation layer 206, and the side surface of the active pillar 210, wherein the metal film 216 and the semiconductor film 217 jointly form a second conductive layer 215.

Figure 31:
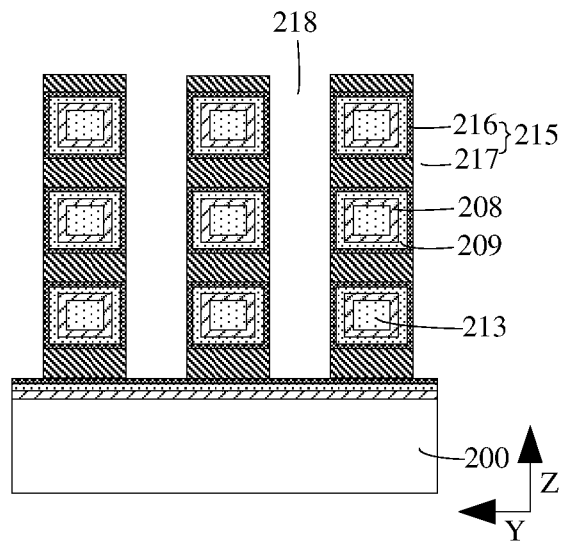

Referring to FIG. 31, the semiconductor film 217 is patterned to form fourth grooves 218, where the fourth grooves 218 are arranged along the second direction, and the fourth groove 218 exposes the surface of the metal film 216.

Figure 24:
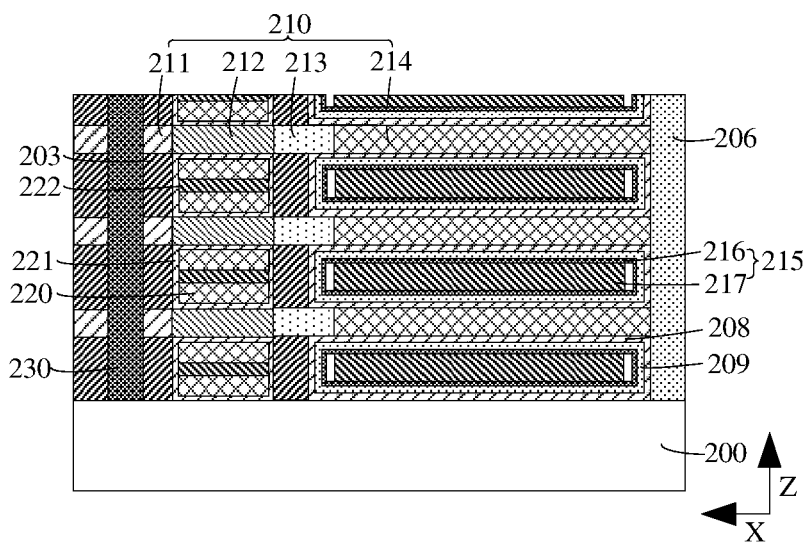
Figure 32:
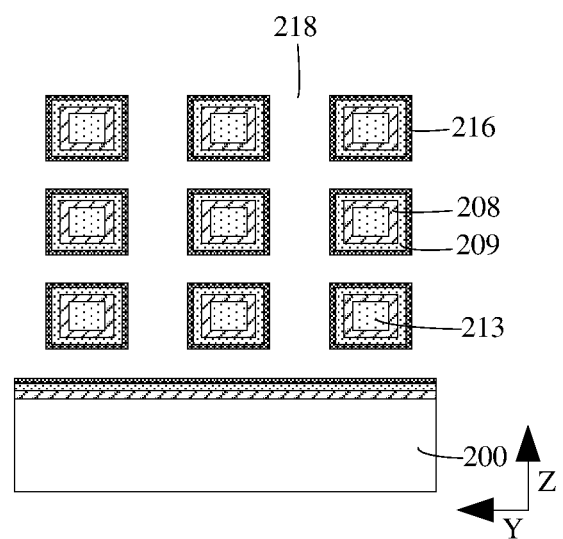

Referring to FIG. 24 and FIG. 32, the semiconductor film 217 is etched along the first direction until the side surface of the metal film 216 is exposed. Meanwhile, the semiconductor film 217 is etched along the arrangement direction of the source region 211 and the drain region 213 of the active pillar 210.

Figure 25:
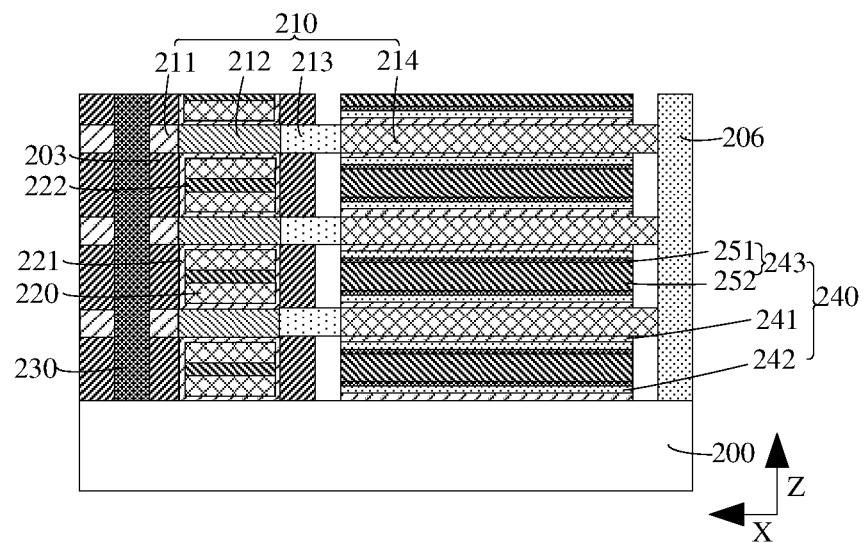
Figure 33:
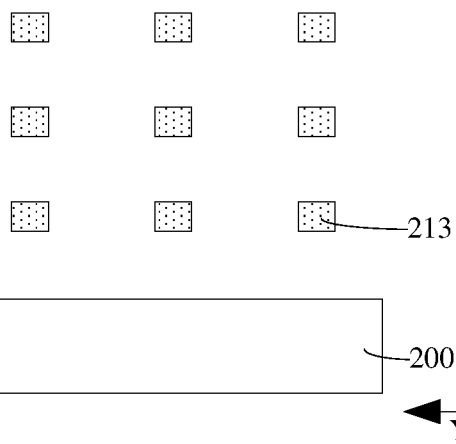

Referring to FIG. 25 and FIG. 33, along the arrangement direction of the source region 211 and the drain region 213 of the active pillar 210, the metal film 216, the dielectric film 209, and the first conductive layer 208 are sequentially etched by partial width, until the side surface of the isolation layer 203 and the surface of the active pillar 210 are exposed.

Figure 26:
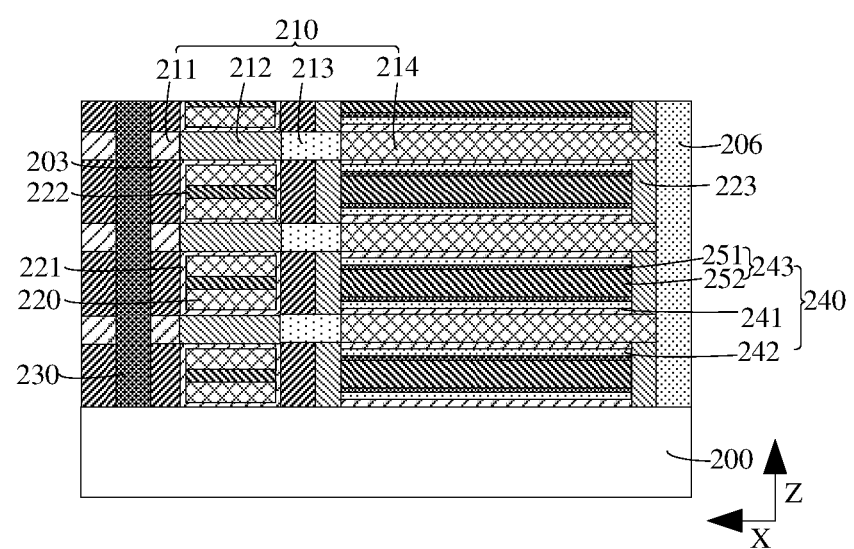
Figure 34:
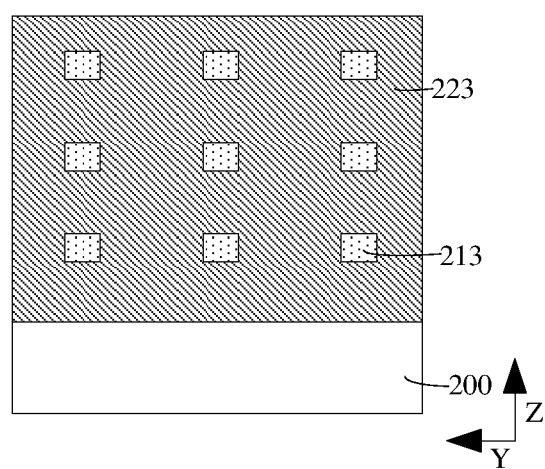

Referring to FIG. 26 and FIG. 34, a second dielectric layer 223 is formed. Along the direction perpendicular to the surface of the base 200, the second is dielectric layer 223 is located between the support regions 214 of adjacent active pillars 210, and the second dielectric layer 223 is further located on the side surface of the first electrode plate 241, the side surface of the first dielectric layer 242, and the side surface of the second electrode plate 243 that are flush with each other.

Figure 35:
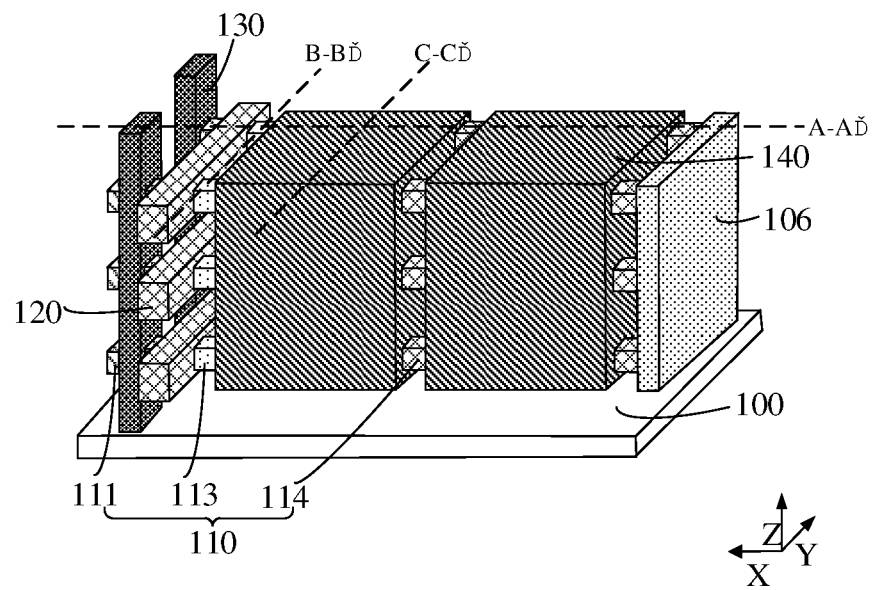
FIG. 35 is a schematic structural diagram of a semiconductor structure according to an embodiment of the present disclosure.
Figure 36:
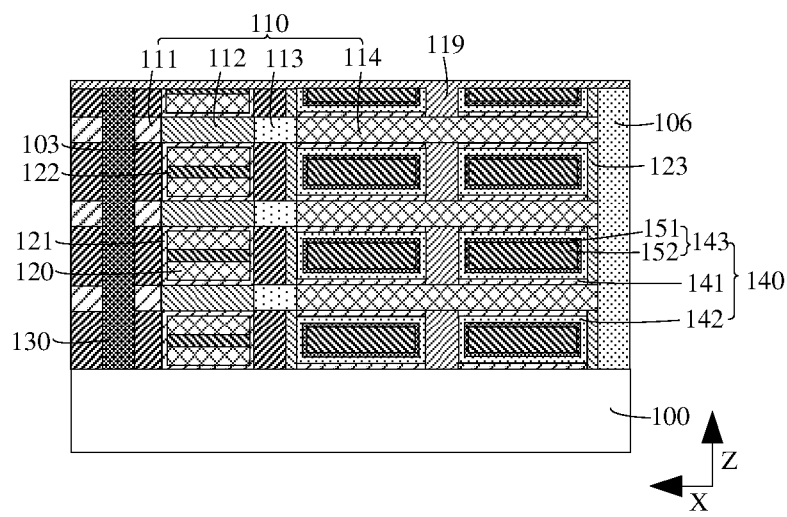
FIG. 36 is a schematic structural cross-sectional diagram of a semiconductor structure along a cross section A-A' according to an embodiment of the present disclosure.
Figure 37:
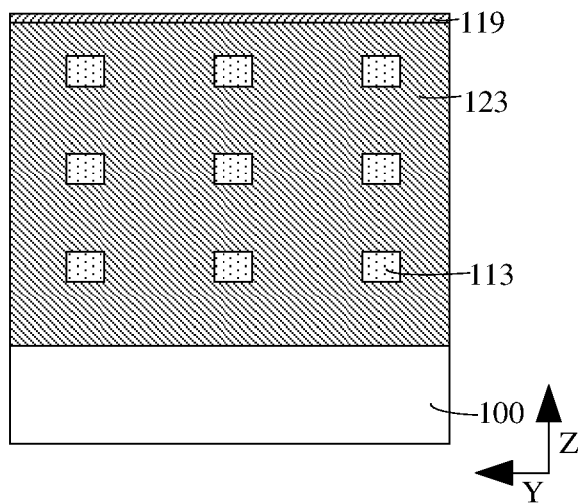
FIG. 37 is a schematic structural cross-sectional diagram of a semiconductor structure along a cross section B-B' according to an embodiment of the present disclosure.
Figure 38:
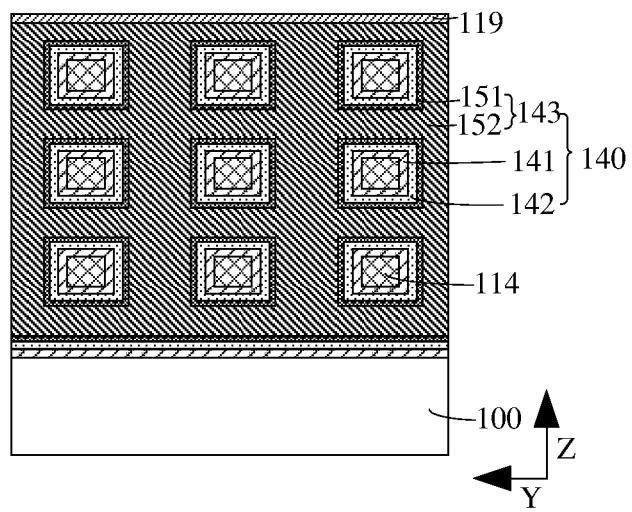
FIG. 38 is a schematic structural cross-sectional diagram of a semiconductor structure along a cross section C-C' according to an embodiment of the present disclosure.

Correspondingly, another embodiment of the present disclosure provides a semiconductor structure manufactured with the above method of manufacturing a semiconductor structure. FIG. 35 is a schematic structural diagram of a semiconductor structure according to an embodiment of the present disclosure; FIG. 36 is a schematic structural cross-sectional diagram of a semiconductor structure along a cross section A-A' according to an embodiment of the present disclosure; FIG. 37 is a schematic structural cross-sectional diagram of a semiconductor structure along a cross section B-B' according to an embodiment of the present disclosure; and FIG. 38 is a schematic structural cross-sectional diagram of a semiconductor structure along a cross section C-C' according to an embodiment of the present disclosure.

Referring to FIG. 35 to FIG. 38, the semiconductor structure includes: a base 100, wherein a bit line 130 extending along a first direction (direction Z perpendicular to the surface of the base 100) is provided on a surface of the base 100; a plurality of active pillars 110, wherein the active pillars 110 are arranged at intervals along direction Z perpendicular to the surface of the base 100, the active pillar 110 includes a source region 111, a channel region 112, a drain region 113, and a support region 114, and the bit line 130 is connected to the source region 111 of the active pillar 110; a word line 120, wherein the word line 120 extends along a second direction (direction Y parallel to the surface of the base 100), and the word line 120 is located between adjacent active pillars 110 and surrounds the channel region 112 of the active pillar 110; and a plurality of memory structures 140, wherein the memory structures 140 are vertically stacked on the base 100, the memory structure 140 is connected to the drain region 113 of the active pillar 110, the memory structure 140 surrounds the support region 114 of the active pillar 110, the memory structures 140 include a first electrode plate 141, a first dielectric layer 142, and a second electrode plate 143 that are sequentially stacked on surfaces of the support regions 114 of the active pillars 110, and an isolation layer 103 is provided between the word line 120 and the memory structures 140.

In some embodiments, a material of the base 100 may be a semiconductor material. The semiconductor material specifically may be any one from the group consisting of silicon, germanium, silicon germanide, or silicon carbide. The bit line 130 is a metal bit line or a semiconductor bit line. In some embodiments, the word line 120, the channel region 112 of the active pillar 110, and the source region 111 and the drain region 113 of the active pillar 110 that are located at two ends of the channel region 112 form a transistor structure. Along a direction from the source region 111 to the drain region 113, at least two transistor structures are provided. Two transistor structures are electrically connected to the same bit line 130. Similarly, the memory structure 140 located at another terminal of the transistor structure may share the same bit line 130. In this way, the embodiments of the present disclosure can implement 3D stacking, and reduce the size of the critical device by sharing the bit line 130, thereby improving the performance of the semiconductor device and the stability of the semiconductor structure. In other embodiments, the bit line 130 is connected to the drain region 113 of the active pillar 110. In other embodiments, the memory structure 140 is connected to the source region 111 of the active pillar 110.

In some embodiments, along the arrangement direction of the source region 111 and the drain region 113 of the active pillar 110, at least two columns of memory structures 140 are provided; and a dielectric layer 119 is arranged between adjacent memory structures 140. The dielectric layer 119 is located between a part of the first dielectric layer 142 of any one of the memory structures 140 and a part of the first dielectric layer 142 of an adjacent memory is structure 140.

In some embodiments, along the direction perpendicular to the base 100, a thickness of a part of the first dielectric layer 142 located on the surface of the first electrode plate 141 is greater than or equal to a thickness of a part of the first dielectric layer 142 located on the side surface of the dielectric layer 119. The thickness of the part of the first dielectric layer 142 located on the side surface of the dielectric layer 119 ranges from 5 nm to 100 nm, and specifically may be 15 nm, 28 nm, 58 nm or 89 nm, which can ensure that the electrically connected parts of the first electrode plate 141 of different transistors are completely disconnected, thereby avoiding failure of the memory structure 140 caused by connection between parts of the first electrode plate 141 corresponding to different transistors. Similarly, the semiconductor structure further includes: a second dielectric layer 123, wherein the second dielectric layer 123 is located between the support regions 114 of adjacent active pillars 110 along the direction perpendicular to the surface of the base 100; the second dielectric layer 123 is further located on the side surface of the first dielectric layer 142; and a thickness of a part of the first dielectric layer 142 located on the surface of the first electrode plate 141 is greater than or equal to a thickness of a part of the first dielectric layer 142 located on the side surface of the second dielectric layer 123. The thickness of the part of the first dielectric layer 142 located on the side surface of the second dielectric layer 123 ranges from 5 nm to 100 nm, and specifically may be 19 nm, 33 nm, 65 nm or 93 nm.

In some embodiments, the semiconductor structure further includes: a gate dielectric layer 121, wherein the gate dielectric layer 121 is located between the word line 120 and the semiconductor layers 102 and between the word line 120 and the isolation layer 103; and a second isolation layer 122, wherein the second isolation layer 122 is located between adjacent word lines 120 along direction Z perpendicular to the surface of the base 100, to isolate the adjacent word lines 120, so as to avoid short-circuit caused by an electrical connection between the adjacent word lines 120.

Figure 39:
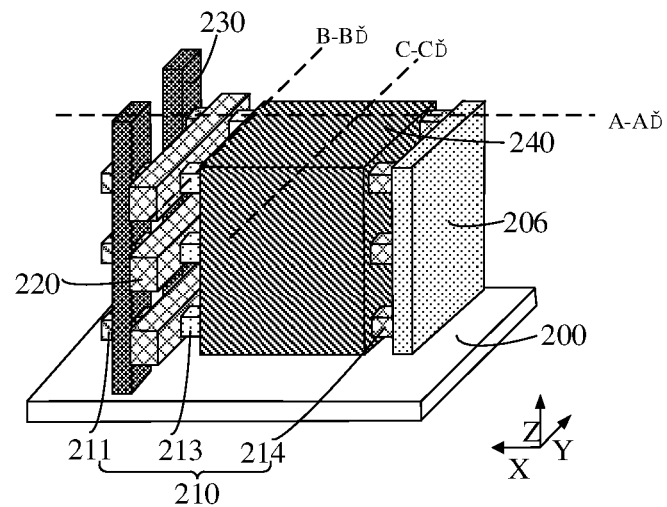
FIG. 39 is a schematic structural diagram of a semiconductor structure according to another embodiment of the present disclosure.
Figure 40:
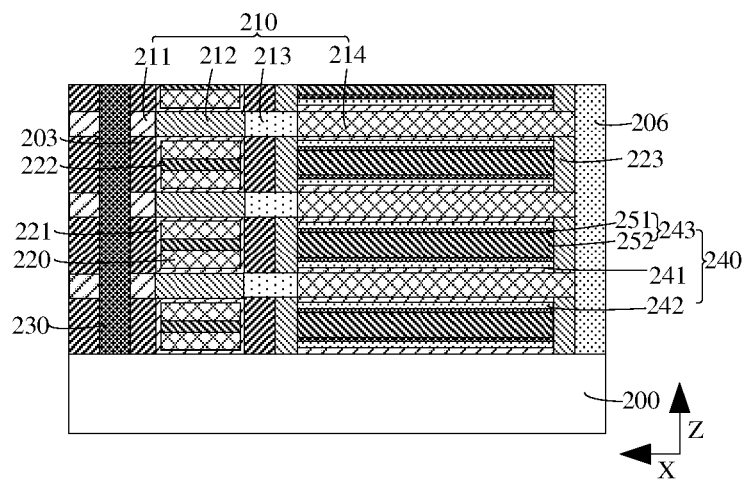
FIG. 40 is a schematic structural cross-sectional diagram of a semiconductor structure along a cross section A-A' according to another embodiment of the present disclosure.
Figure 41:
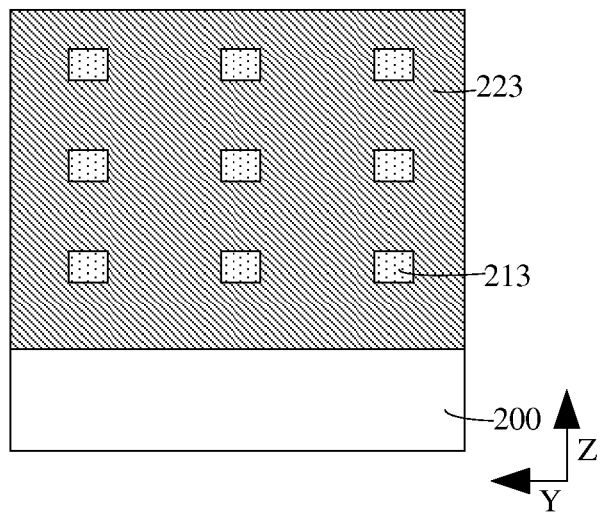
FIG. 41 is a schematic structural cross-sectional diagram of a semiconductor structure along a cross section B-B' according to an embodiment of the present disclosure.
Figure 42:
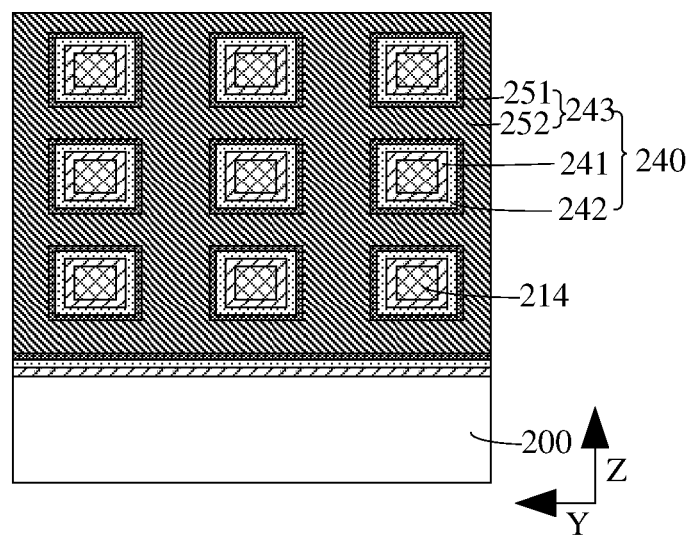
FIG. 42 is a schematic structural cross-sectional diagram of a semiconductor structure along a cross section C-C' according to an embodiment of the present disclosure.

The foregoing embodiment is described by using an example in which the semiconductor structure is manufactured by etching the first conductive layer. Another embodiment of the present disclosure further provides a semiconductor structure. The semiconductor structure provided by another embodiment of the present disclosure is substantially the same as the semiconductor structure provided by the foregoing embodiment, and the main difference is that a side surface of the first electrode plate, a side surface of the first dielectric layer, and a side surface of the second electrode plate are flush with each other along the arrangement direction of the source region and the drain region of the active pillar. FIG. 39 is a schematic structural diagram of a semiconductor structure according to another embodiment of the present disclosure; FIG. 40 is a schematic structural cross-sectional diagram of a semiconductor structure along a cross section A-A' according to another embodiment of the present disclosure; FIG. 41 is a schematic structural cross-sectional diagram of a semiconductor structure along a cross section B-B' according to an embodiment of the present disclosure; and FIG. 42 is a schematic structural cross-sectional diagram of a semiconductor structure along a cross section C-C' according to an embodiment of the present disclosure.

Referring to FIG. 39 to FIG. 42, the semiconductor structure includes: a base 200, wherein a bit line 230 extending along a first direction (direction Z perpendicular to the surface of the base 200) is provided on a surface of the base 200; a plurality of active pillars 210, wherein the active pillars 210 are arranged at intervals along direction Z perpendicular to the surface of the base 200, the active pillar 210 includes a source region 211, a channel region 212, a drain region 213, and a support region 214, and the bit line 230 is connected to the source region 211 of the active pillar 210; a word line 220, wherein the word line 220 extends along a second direction (direction Y parallel to the surface of the base 200), and the word line 220 is located between adjacent active pillars 210 and surrounds the channel region 212 of the active pillar 210; and a plurality of is of memory structures 240, wherein the memory structures 240 are vertically stacked on the base 200, the memory structure 240 is connected the drain region 213 of the active pillar 210, the memory structure 240 surrounds the support region 214 of the active pillar 210, the memory structures 240 include a first electrode plate 241, a first dielectric layer 242, and a second electrode plate 243 that are sequentially stacked on surfaces of the support regions 214 of the active pillars 210, and an isolation layer 203 is provided between the word line 220 and the memory structures 240.

In some embodiments, along an arrangement direction of the source region 211 and the drain region 213 of the active pillar 210, a side surface of the first electrode plate 241, a side surface of the first dielectric layer 242, and a side surface of the second electrode plate 243 are flush with each other. The semiconductor structure further includes: a second dielectric layer 223, wherein along the direction perpendicular to the surface of the base 200, the second dielectric layer 223 is located between the support regions 214 of adjacent active pillars 210, and the second dielectric layer 224 is further located on the side surface of the first electrode plate 241, the side surface of the first dielectric layer 242, and the side surface of the second electrode plate 243 that are flush with each other.

Those of ordinary skill in the art can understand that the above implementations are specific embodiments for implementing the present disclosure. In practical applications, various changes may be made to the above embodiments in terms of forms and details without departing from the spirit and scope of the present disclosure. Any person skilled in the art may make changes and modifications to the embodiments without departing from the spirit and scope of the present disclosure. Therefore, the protection scope of the present disclosure should be subject to the scope defined by the claims.

The invention claimed is:

1. A method of manufacturing a semiconductor structure, comprising:
   providing a base;
   forming active pillars and a bit line that extends along a first direction, wherein the bit line is located on a surface of the base, the active pillars are arranged at intervals along a direction perpendicular to the surface of the base, the active pillar comprises a source region, a channel region, a drain region, and a support region, and the bit line is connected to one of the source region and the drain region of the active pillar;
   forming a word line extending along a second direction, wherein the word line is located between adjacent active pillars and surrounds the channel region of the active pillar; and
   forming a plurality of memory structures, wherein the memory structures are vertically stacked on the base, the memory structure is connected to the other one of the source region and the drain region of the active pillar, the memory structure surrounds the support region of the active pillar, and the memory structures comprise a first electrode plate, a first dielectric layer, and a second electrode plate that are sequentially stacked on surfaces of the support regions of the active pillars; and forming the memory structures comprises:
   providing an isolation layer between the word line and the memory structures, and forming a first conductive layer, a dielectric film, and a second conductive layer that are continuously and sequentially stacked on a side surface of the isolation layer and a surface of the active pillar; and
   etching to remove a part of the first conductive layer located on the side surface of the isolation layer, to expose a side surface of the dielectric film, and taking a remaining part of the first conductive layer as the first electrode plate, a remaining part of the dielectric film as the first dielectric layer, and the second conductive layer as the second electrode plate;
   wherein during the etching to remove a part of the first conductive layer located on the side surface of the isolation layer, a thickness of the dielectric film is reduced along an arrangement direction of the source region and the drain region of the active pillar.

2. The method of manufacturing a semiconductor structure according to claim 1, before the forming the memory structures, the method further comprises:
   providing an initial base, and forming first sacrificial films and semiconductor layers that are sequentially arranged at intervals on a surface of the initial base;
   patterning a part of the first sacrificial films and a part of the semiconductor layers, and forming first grooves, wherein a bottom of the first groove exposes the initial base;
   etching to remove a part of the first sacrificial films, to expose a surface of a remaining part of the semiconductor layers; and
   sequentially forming the first conductive layer, the dielectric film, and the second conductive layer that are stacked on the surface of the remaining part of the semiconductor layers, the surface of the initial base, and a side surface of a remaining part of the first sacrificial films, wherein the remaining part of the semiconductor layers is used as the active pillars.

3. The method of manufacturing a semiconductor structure according to claim 2, before the etching to remove a part of the first conductive layer located on the side surface of the isolation layer, the method further comprises: patterning a part of the first sacrificial films and a part of the semiconductor layers, to form a second groove, wherein a bottom of the second groove exposes the initial base, and removing a part of the first sacrificial films, to expose a side surface of the first conductive layer.

4. The method of manufacturing a semiconductor structure according to claim 3, after the forming first grooves, the method further comprises: patterning the first sacrificial films and the semiconductor layers, and forming a third groove, wherein the third groove is located between adjacent first grooves, and forming a second sacrificial film in the third groove; and removing the second sacrificial film while removing the first sacrificial films.

5. The method of manufacturing a semiconductor structure according to claim 1, wherein the second conductive layer comprises a metal film and a semiconductor film; and before the etching to remove a part of the first conductive layer located on the side surface of the isolation layer, the method further comprises: patterning the semiconductor film to form fourth grooves, wherein the fourth grooves are arranged along the second direction, and the fourth grooves expose a surface of the metal film; sequentially etching to remove the metal film, the dielectric film, and the first conductive layer by a partial width along an arrangement direction of the source region and the drain region of the active pillar, until the side surface of the isolation layer and the surface of the active pillar are exposed.

6. The method of manufacturing a semiconductor structure according to claim 5, before the sequentially etching to remove the metal film, the dielectric film, and the first conductive layer by a partial width, the method further comprises: etching the semiconductor film along the arrangement direction of the source region and the drain region of the active pillar.

7. A semiconductor structure manufactured with the method of manufacturing a semiconductor structure according to claim 1, comprising:
   a base, wherein a bit line extending along a first direction is provided on a surface of the base;
   a plurality of active pillars, wherein the active pillars are arranged at intervals along a direction perpendicular to the surface of the base, the active pillar comprises a source region, a channel region, a drain region, and a support region, and the bit line is connected to one of the source region and the drain region of the active pillar;
   a word line, wherein the word line extends along a second direction, and the word line is located between adjacent active pillars and surrounds the channel region of the active pillar; and
   a plurality of memory structures, wherein the memory structures are vertically stacked on the base, the memory structure is connected to the other one of the source region and the drain region of the active pillar, the memory structure surrounds the support region of the active pillar, the memory structures comprise a first electrode plate, a first dielectric layer, and a second electrode plate that are sequentially stacked on surfaces of the support regions of the active pillars, and an isolation layer is provided between the word line and the memory structures.

8. The semiconductor structure according to claim 7, comprising at least two columns of memory structures along an arrangement direction of the source region and the drain region of the active pillar; and a dielectric layer is arranged between adjacent memory structures.

9. The semiconductor structure according to claim 8, wherein the dielectric layer is located between a part of the first dielectric layer of any one of the memory structures and a part of the first dielectric layer of an adjacent memory structure.

10. The semiconductor structure according to claim 9, wherein along the direction perpendicular to the surface of the base, a thickness of a part of the first dielectric layer located on a surface of the first electrode plate is greater than or equal to a thickness of a part of the first dielectric layer on a side surface of the dielectric layer.

11. The semiconductor structure according to claim 10, wherein the thickness of the part of the first dielectric layer on the side surface of the dielectric layer ranges from 5 nm to 100 nm.

12. The semiconductor structure according to claim 7, wherein along the first direction, a second dielectric layer is provided between the support regions of adjacent active pillars, and the second dielectric layer is further located on a side surface of the first dielectric layer; a thickness of a part of the first dielectric layer on a surface of the first electrode plate is greater than or equal to a thickness of a part of the first dielectric layer on a side surface of the second dielectric layer.

13. The semiconductor structure according to claim 12, wherein the thickness of the part of the first dielectric layer on the side surface of the second dielectric layer ranges from 5 nm to 100 nm.

14. The semiconductor structure according to claim 7, wherein along an arrangement direction of the source region and the drain region of the active pillar, a side surface of the first electrode plate, a side surface of the first dielectric layer, and a side surface of the second electrode plate are flush with each other.

* * * * *